(12) United States Patent
Orlowski et al.

(10) Patent No.: US 7,135,379 B2
(45) Date of Patent: Nov. 14, 2006

(54) ISOLATION TRENCH PERIMETER IMPLANT FOR THRESHOLD VOLTAGE CONTROL

(75) Inventors: Marius K. Orlowski, Austin, TX (US); James D. Burnett, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/955,658

(22) Filed: Sep. 30, 2004

(65) Prior Publication Data

US 2006/0068542 A1    Mar. 30, 2006

(51) Int. Cl.
*H01L 21/76*    (2006.01)

(52) U.S. Cl. .................. 438/426; 438/424; 438/425

(58) Field of Classification Search ............. 438/424, 438/417, 287, 149, 361, 207, 243, 426, 425
See application file for complete search history.

(56) References Cited

U.S. PATENT DOCUMENTS

| | | | |
|---|---|---|---|
| 6,097,076 A * | 8/2000 | Gonzalez et al. | 438/424 |
| 2002/0160573 A1 * | 10/2002 | Peake et al. | 438/270 |
| 2004/0067620 A1 | 4/2004 | Mehrad et al. | |

OTHER PUBLICATIONS

De Gyvez et al.; Threshold Voltage Mismatch and Intra-Die Leakage Current in Digital CMOS Circuits, IEEE ED 39, p. 137, 2004.
Fuse et al; Narrow-Width Effects of Shallow Trench-Isolation Method with Boron-implanted Sidewalls for Controlling Narrow Width Effect; IEEE ED 34, p. 356, 1987.
Ohe et al.; Narrow-Width Effects of Shallow Trench-Isolated CMOS with n+ Polysilicon Gate; IEEE ED 36, p. 1110, 1989.
Kim et al.; A Shallow Trench Isolation Using Nitric Oxide (NO)-Annealed Wall Oxide to Suppress Inverse Narrow Width Effect; IEEE ED 21, p. 575, 2000.

* cited by examiner

*Primary Examiner*—Walter Lindsay, Jr.

(57) ABSTRACT

A method of forming isolation trenches in a semiconductor fabrication process to reduce transistor channel edge effect currents includes forming a masking structure overlying a substrate to expose a first area of the substrate. Spacers are formed on sidewalls of the masking structure. The spacers cover a perimeter region of the first area thereby leaving a second smaller area exposed. The region underlying the second area is etched to form an isolation trench that is then filled with a dielectric. The spacers are removed to expose the perimeter region. Using the masking structure and the trench dielectric as a mask, an impurity distribution is implanted into a portion of the substrate underlying the perimeter region. The impurity distribution thus surrounds a perimeter of the trench dielectric proximal to an upper surface of the substrate. The perimeter impurity distribution dopant, in a typical case, is p-type for NMOS transistors and n-type for PMOS.

10 Claims, 3 Drawing Sheets

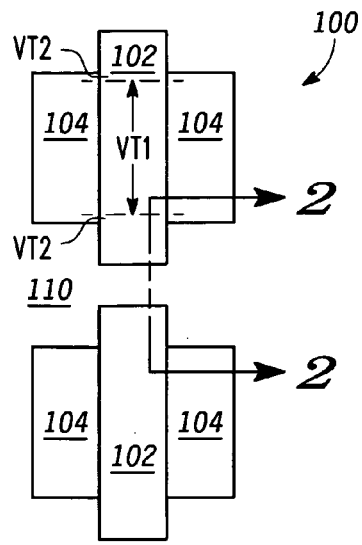
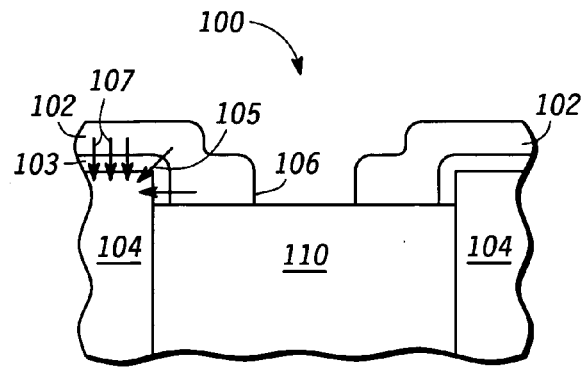
FIG. 1
—PRIOR ART—
FIG. 2
—PRIOR ART—
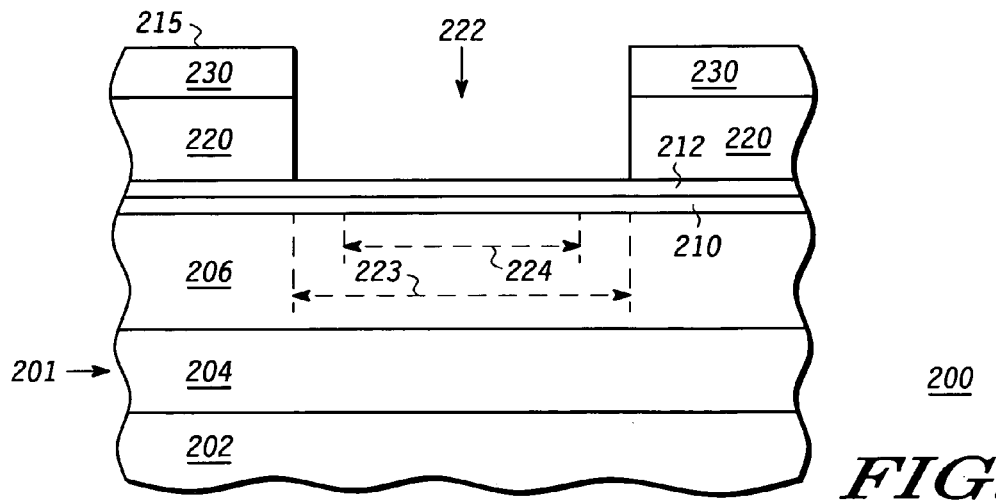
FIG. 3
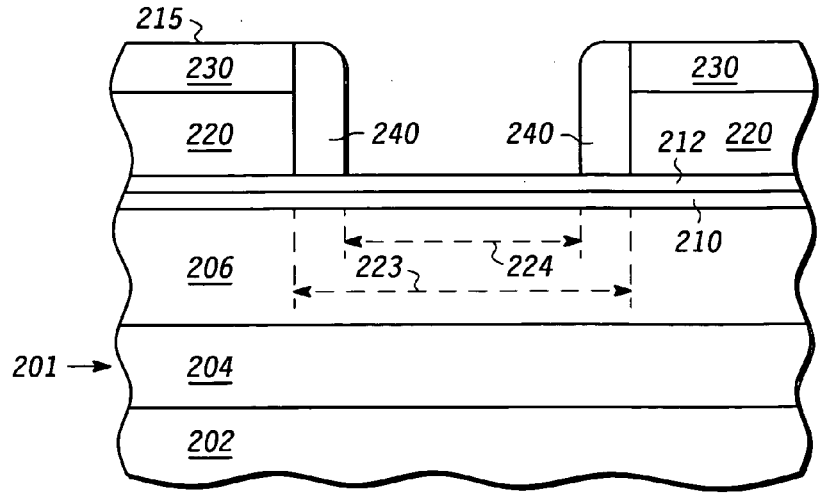
FIG. 4

US 7,135,379 B2

ISOLATION TRENCH PERIMETER IMPLANT FOR THRESHOLD VOLTAGE CONTROL

FIELD OF THE INVENTION

The present invention is in the field of semiconductor fabrication processes and, more particularly, CMOS processes employing isolation trenches.

RELATED ART

In a CMOS (complementary metal-oxide-semiconductor) fabrication process, shallow trench isolation is used to provide physical and electrical isolation between adjacent transistors. Referring to FIG. 1 and FIG. 2, a conventional tAOS transistor 100 is shown from above (FIG. 1) and in cross-section (FIG. 2) taken along the line 2—2 of FIG. 1. Transistor 100 includes a gate electrode 102 overlying an active region 104 and separated from active region 104 by a gate dielectric 103. An isolation trench 110 is located between adjacent active regions 104. Gate electrode 102 must traverse the entire active region 104 to form a transistor. Thus, the ends of gate electrode 102 (represented by reference numeral 106) extend beyond the active region boundary and terminate on isolation trench 110.

As seen in FIG. 2, gate electrode 102 is typically not completely planar, especially at the boundary between channel region 104 and isolation trench 110 where there may be a step. The bending of gate electrode 102 as it conforms to the underlying topology at the edge of the active region 104 causes an increase in the density of electric field lines (represented by reference numeral 107) at the boundary of active region 104 when gate electrode 102 is biased relative to active region 104. Whereas the field lines 107 in the planar portions of gate electrode 102 are relatively uniform, the field line density may increase dramatically where gate electrode 102 traverses even moderate underlying topological transitions (e.g., at the interface between active region 104 and isolation trench 110).

The increase in field density at the edges of active region 104 produces an unwanted phenomenon in which the "localized" threshold voltage (the voltage required to induce a conductive channel in the underlying semiconductor) is lower at the edges of the active region than it is elsewhere. In the top view of FIG. 1, a first threshold voltage VT1 is indicated for the central portions of gate electrode 102 and a second threshold voltage VT2 is indicated for the edges portions of the electrode where VT2 is less than VT1. The variance between VT1 and VT2 may be exacerbated by other effects such as thinning of the gate dielectric layer at the corner of the active region and depletion or accumulation of dopants due to dopant diffusion and segregation effects. This edge effect is represented schematically in the circuit diagram of FIG. 11, where transistor 100 is shown as including a residual or parasitic transistor 120, sometimes referred to herein as edge transistor 120, in parallel with the "intended" or central transistor 100'. The threshold voltage of intended transistor 100' is VT1 while the threshold voltage for edge transistor 120 is VT2. The presence of edge transistor 120 in parallel with intended transistor 100' results in undesirable subthreshold currents as edge transistor 120 turns on before the rest of the transistor.

It would be desirable to implement a fabrication method that addressed the edge transistor problem by effectively adjusting the edge transistor threshold voltage (in absolute value terms) such that the edge device threshold voltage is as close as possible to the intended transistor threshold voltage. It would be further desirable if the implemented method did not introduce significant additional processing steps, such as additional photolithography steps, into the process flow.

BRIEF DESCRIPTION OF THE DRAWINGS

The present invention is illustrated by way of example and not limited by the accompanying figures, in which like references indicate similar elements, and in which:

FIG. 1 is a top view of a transistor according to the prior art;

FIG. 2 is a cross sectional view taken along the 2—2 line of FIG. 1;

FIG. 3 is a partial cross-sectional view of a wafer at a first selected stage in a fabrication process according to an embodiment of the present invention in which a patterned masking structure is formed overlying a substrate to expose a first area of the underlying substrate;

FIG. 4 depicts processing subsequent to FIG. 3 in which spacers are formed on sidewalls of the patterned masking structure to cover a perimeter portion of the first area, thereby leaving a second, smaller area exposed;

Figure 5:
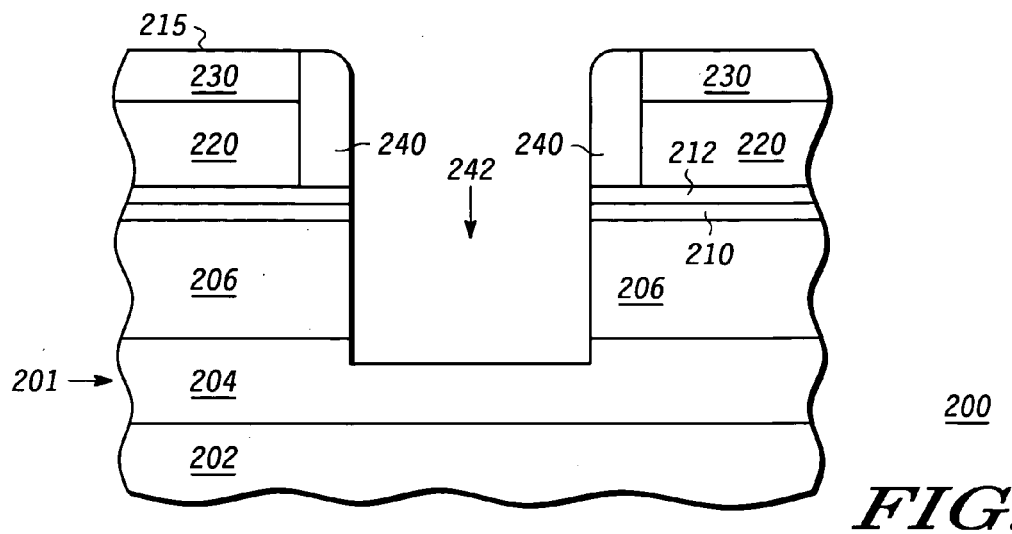
FIG. 5 depicts processing subsequent to FIG. 4 in which an isolation trench is formed in the substrate under the second area.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the present invention is concerned with reducing a leakage-like current caused by narrow conductive paths that form along the edges of a transistor channel (adjacent an isolation trench) at subthreshold voltages. A process sequence produces a mask that is self-aligned to the isolation trench. The mask exposes a perimeter region surrounding the isolation trenches. A subsequent implant introduces a trench perimeter impurity distribution that counters threshold voltage lowering occurring at the channel edges. With this process, the threshold voltage of the unintended "edge transistor" is increased to match (or exceed) the threshold voltage of the non-edge portions of the transistor.

Referring now to the drawings, FIG. 3 is a cross sectional view of a semiconductor wafer 200 at a first selected stage in a fabrication process according to one embodiment of the present invention. In the depicted embodiment, a patterned masking structure 215 is formed over a wafer substrate 201 using conventional deposition, photolithography, and etch processing. Substrate 201 in the depicted embodiment is an SOI (silicon-on-insulator) wafer substrate that includes an epitaxial silicon (or other semiconductor) top layer 206 overlying a buried oxide (BOX) layer 204 overlying a silicon bulk substrate 202. SOI wafers are effective in decreasing junction capacitance that retards performance and increases power consumption in conventional, bulk wafers.

In the depicted embodiment, patterned masking structure 215 formed overlying substrate 201 includes a patterned second layer 230 overlying a patterned first layer 220. First layer 220 and second layer 230 are deposited in sequence and then masked and etched using a single masking step. The patterned masking structure 215 defines a void 222 that exposed a first area (indicated by reference numeral 223) of the underlying substrate 201. In the preferred embodiment, first area 223 exposed by void 222 is bigger than a second area 224 into which an isolation trench will be formed.

In one embodiment, first patterned layer 220 is polycrystalline silicon (polysilicon) formed by a conventional thermal decomposition of silane process or another suitable polysilicon deposition process. The patterned second layer 230 is preferably a silicon nitride layer. Furthermore, the depicted embodiment shows a pad oxide layer 210 overlying substrate 201 and an optional, thin silicon nitride layer 212 overlying pad oxide layer 210 upon which patterned masking structure 215 is fabricated. Silicon nitride layer 212 is useful in one embodiment as a stop layer for a subsequent chemical mechanical polish process.

Referring now to FIG. 4, spacers 240 are formed on the sidewalls of patterned masking structure 215. Spacers 240 are preferably comprised of silicon nitride and formed by depositing a conformal silicon nitride film over patterned masking structure 215 and etching the conformal film anisotropically. Using known spacer etch techniques, the width of spacers 240 can be precisely controlled.

In the depicted embodiment, spacers 240 mask a perimeter region that encircles first area 223. The perimeter region covered by spacers 240 leaves second area 224 of substrate 201 unprotected. As indicated above, second area 224 overlies the region into which an isolation trench will be formed. Thus, first area 223 exposed by patterned masking structure 215 includes second area 224 and the perimeter region covered by spacers 240.

Referring now to FIG. 5, an isolation trench 242 is etched into the second region 224 (FIG. 4) of substrate 201 using patterned masking structure 215 and spacers 240 as an etch mask. Thus, the resulting isolation trench 242 is self-aligned to the sidewalls of spacers 240. Similarly, the perimeter region covered by spacers 240 is self-aligned to isolation trench 242. Moreover, it will be appreciated that formation of the isolation trench and the self aligned spacers 240 as described required only a single photolithography step, namely, the step required to define patterned masking structure 215.

Figure 6:
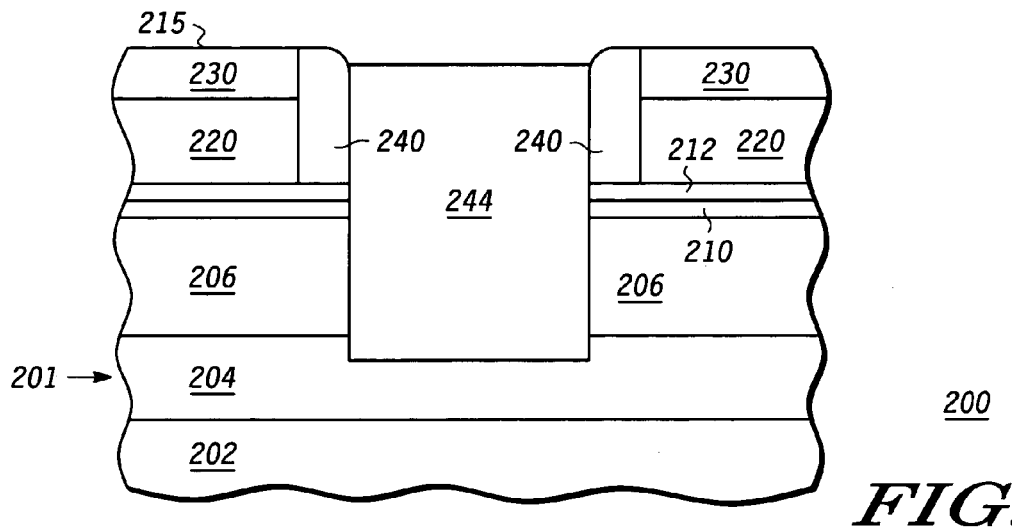
FIG. 6 depicts processing subsequent to FIG. 5 in which the trench is filled with an isolation dielectric.

Referring now to FIG. 6, isolation trench 242 of FIG. 5 is filled with an isolation dielectric 244. The isolation dielectric 244 is preferably a plasma deposited silicon-oxide compound. After deposition, the deposited isolation dielectric may be removed by polishing or another technique to eliminate portions of the isolation dielectric exterior to trench 242.

Figure 7:
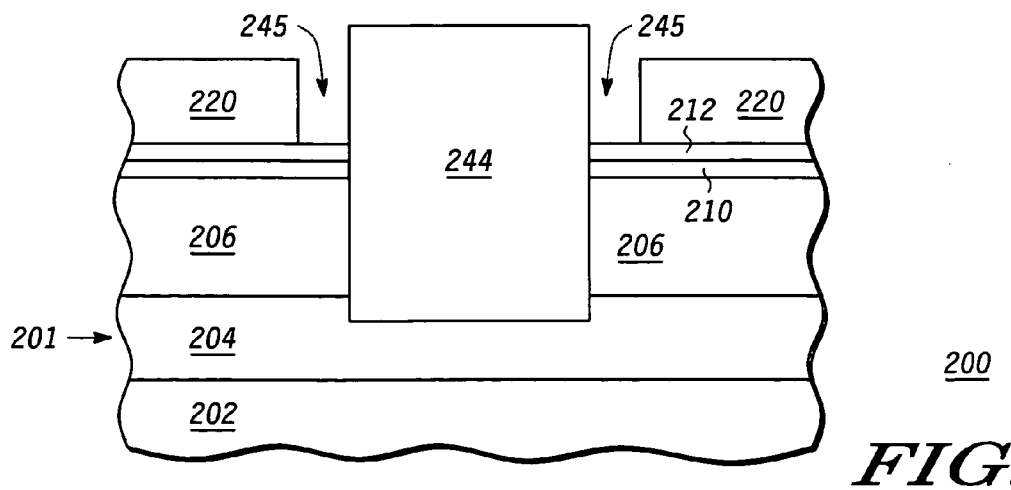
FIG. 7 depicts processing subsequent to FIG. 6 in which the spacers are removed to expose the perimeter area surrounding the trench.

Referring now to FIG. 7, spacers 240 have been removed to expose a substrate perimeter region 245 surrounding isolation dielectric 244. In the depicted embodiment, second patterned layer 230, spacers 240, and polish stop layer 212 are all comprised of silicon nitride. Thus, the process used to remove spacers 240, which is a preferably a conventional silicon nitride etch, most likely also removes all or most of second masking layer 230 and polish stop layer 212. FIG. 7 thus illustrates a masking structure overlying substrate 201 that exposes perimeter region 245 surrounding isolation dielectric 244. This masking structure includes the remaining portion of patterned masking structure 215 (i.e., patterned first layer 220) and the trench isolation dielectric 244.

Figure 8:
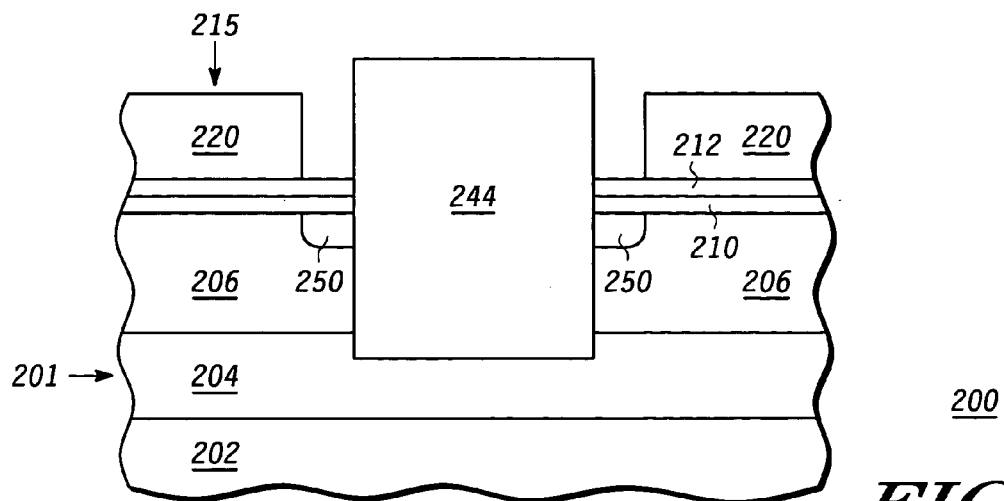
FIG. 8 depicts processing subsequent to FIG. 7 in which a trench perimeter impurity distribution is introduced into the perimeter area surrounding the isolation trench.

Referring now to FIG. 8, a trench perimeter impurity distribution 250 is implanted or otherwise introduced into the wafer substrate using first patterned layer 220 and isolation dielectric 244 as a mask. Trench perimeter impurity distribution 250 is thus contained within the perimeter region 245 surrounding isolation dielectric 244. In the preferred embodiment, the trench perimeter impurity distribution has a conductivity type (i.e., p-type or n-type) that counters the edge transistor effect described above by raising the threshold voltage at the edge of the gate electrode. For NMOS transistors, for example, trench perimeter impurity distribution 250 is preferably boron or another p-type impurity that has the effect of adjusting the threshold voltage required to turn on the edge transistor channel. For PMOS transistors, an n-type impurity such as arsenic or phosphorous is used for the implant. Since PMOS transistors sit in an n-type well and NMOS transistors reside in a p-type well, the conductivity type of the trench perimeter impurity distribution is the same as the conductivity type of the well in which the corresponding transistors reside. However, in some cases, an implant of opposite polarity doping may be used as a threshold voltage to adjust counter-doping. This embodiment applies to situations in which the doping in the coiner regions is too high caused, for example, by positive segregation effects at the semiconductor/oxide interfaces. The dose used to form trench perimeter impurity distribution 250 preferably produces a distribution having an impurity concentration that exceeds the carrier concentration of the well. In the case of NMOS transistors, for example, the p-well is preferably lightly doped (p31 ) while trench perimeter impurity distribution 250 is more heavily doped (p or p+). The implant energy used to form trench perimeter impurity distribution 250 is preferably sufficient to form distribution 250 having a depth less than or equal to the depth of a subsequently formed source/drain extension region or less.

Figure 9:
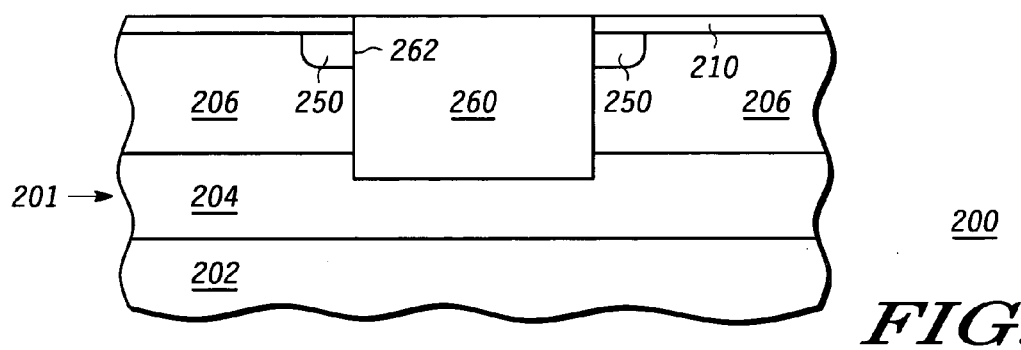
FIG. 9 depicts processing subsequent to FIG. 8 in which the isolation dielectric is polished.

Referring now to FIG. 9, wafer 200 is subjected to a chemical mechanical polish process to produce a substantially planar substrate upper surface and thereby form the isolation trench 260. In this embodiment, the presence of the polish stop layer 212 (which has been removed in FIG. 9) overlying the pad oxide layer 210 beneficially facilitates the polish process, which can be terminated based on detection of silicon nitride from polish stop layer 212. It should be noted that the upper surface of the isolation trench 260 can be coplanar with the top surface of the SOI layer 206, displaced above it, or displaced below it.

Figure 10:
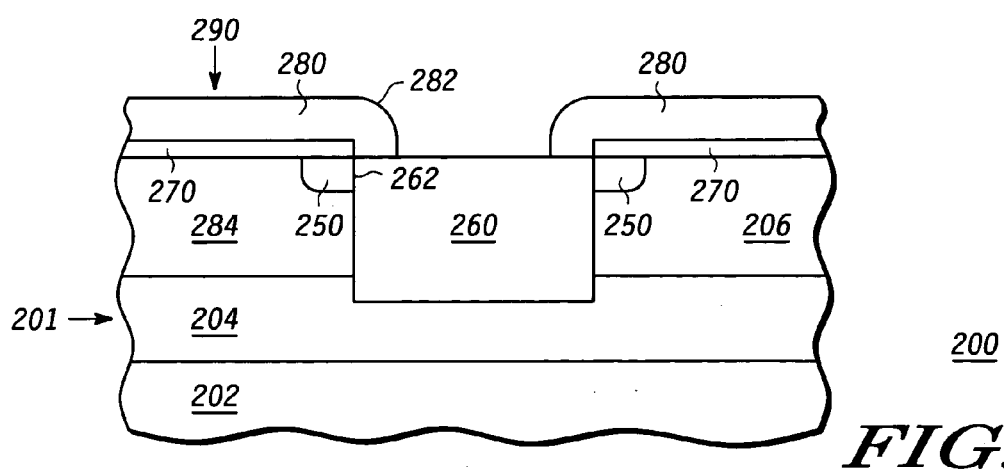
FIG. 10 depicts processing subsequent to FIG. 9 in which a gate dielectric and a gate electrode are formed to form a transistor.
Figure 11:
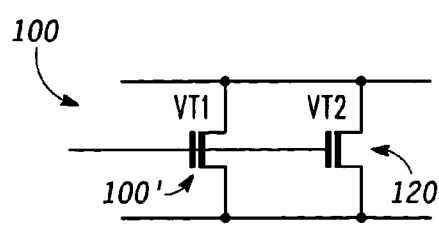
FIG. 11 is a circuit diagram representation of the transistor of FIG. 1.

Referring now to FIG. 10, pad oxide 210 is removed and a gate dielectric 270 and a gate electrode 280 are formed to complete the transistor (represented by reference numeral 290). Transistor 290 according to the present invention thus includes gate electrode 280 overlying gate dielectric 270, which overlies an active region 284 of the transistor. An extremity 282 of gate electrode 280 terminates on an isolation trench 260 that is adjacent active region 284. A trench perimeter impurity distribution 250 is confined within active region 284 to a perimeter region surrounding isolation trench 260. The presence of trench impurity distribution 250 at the edges of active region 284 beneficially adjusts the absolute value of the threshold voltage under the extremities 282 of gate electrode 280 thereby reducing or eliminating the edge transistor effect. Ideally, the concentration of trench perimeter impurity distribution 250 is sufficient to raise the edge threshold voltage to equal the threshold voltage at the center of the gate electrode so that the edge effect leakage current is eliminated without sacrificing the saturated drain current of the transistor.

In the foregoing specification, the invention has been described with reference to specific embodiments. However, one of ordinary skill in the art appreciates that various modifications and changes can be made without departing from the scope of the present invention as set forth in the claims below. For example, the patterned masking structure 215 may be comprised of materials other than polysilicon and silicon nitride. The wafer 200, although illustrated as an SOI wafer, may be a conventional bulk wafer as well. Various materials may be used for gate electrode 280 including polysilicon, titanium, and other metal materials. Similarly, gate dielectric 270 may be a thermally formed silicon dioxide, a high K metal-oxide compound, or another suitable dielectric. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of forming isolation trenches in a semiconductor fabrication process, comprising:
   forming a patterned masking structure overlying a substrate to expose a first area of the substrate;
   forming spacers on sidewalls of the patterned masking structure, wherein the spacers cover a perimeter region of the first area thereby leaving a second area, smaller than the first area, exposed;
   etching the second exposed area to form an isolation trench and filling the trench with a trench dielectric;
   removing the spacers to expose the perimeter region;
   using the masking structure and the trench dielectric as a mask, implanting an impurity into a portion of the substrate underlying the exposed perimeter region wherein the implanted impurity surrounds a perimeter of the trench dielectric proximal to an upper surface of the substrate;
   prior to depositing the first and second masking layers, depositing a pad layer overlying the substrate, wherein the first pad layer comprises an oxide; and
   following deposition of the pad layer and prior to forming the patterned masking structure, depositing a polish stop layer overlying the pad layer.

2. The method of claim 1, wherein forming the patterned masking structure includes depositing a first masking layer overlying the substrate, depositing a second masking layer overlying the first masking layer, and patterning the first and second masking layers.

3. The method of claim 2, wherein the first masking layer is polycrystalline silicon (polysilicon) and the second masking layer is silicon nitride.

4. The method of claim 3, wherein the spacers are comprised of silicon nitride.

5. The method of claim 1, wherein the polish stop layer comprises silicon nitride.

6. The method of claim 1, further comprising, following implanting the impurity species, polishing the wafer to remove the masking structure and a portion of the trench dielectric that is exterior to the isolation trench.

7. A semiconductor fabrication process, comprising:
   forming an isolation trench in a semiconductor substrate;
   filling the trench with an isolation dielectric;
   forming an impurity distribution below an upper surface of a semiconductor substrate, wherein the impurity distribution is confined to a perimeter region surrounding the isolation trench and wherein a conductivity type of the implanted species and a conductivity type of a substrate well in which the isolation trench resides are the same; and
   forming a silicon nitride polish stop layer overlying the pad oxide layer and underlying the polysilicon layer
   wherein forming the isolation trench includes:
   exposing a first area of the substrate, wherein the first area includes a second area into which the isolation trench is formed and the perimeter region surrounding the isolation trench;
   masking the perimeter region surrounding the second area thereby leaving the second area exposed; and
   etching the exposed second area;
   wherein exposing the first area of the substrate comprises forming a patterned masking structure overlying a pad oxide layer overlying the substrate, wherein the patterned masking structure is patterned to expose the first area of the substrate;
   wherein forming the patterned masking structure comprises depositing a first masking layer overlying the pad oxide layer and depositing a second masking layer overlying the first masking layer; and
   wherein the first masking layer is polycrystalline silicon (polysilicon) and wherein the second masking layer is silicon nitride.

8. The method of claim 7, wherein forming the impurity distribution confined to the perimeter region includes:
   following filling the trench with the isolation dielectric, selectively removing the perimeter region mask; and
   implanting the impurity distribution into the substrate using the isolation dielectric and the patterned masking structure as an implant mask.

9. The method of claim 8, wherein the isolation dielectric is a silicon-oxide and wherein the perimeter region mask comprises silicon nitride.

10. A semiconductor fabrication process, comprising:
    forming an isolation trench in a semiconductor substrate;
    filling the trench with an isolation dielectric;
    forming an impurity distribution below an upper surface of a semiconductor substrate, wherein the impurity distribution is confined to a perimeter region surrounding the isolation trench and wherein a conductivity type of the implanted species and a conductivity type of a substrate well in which the isolation trench resides are the same; and forming a gate dielectric overlying the substrate and a gate electrode overlying the gate dielectric to form a transistor, wherein exterior portions of the gate electrode overlie the impurity distribution, and wherein a conductivity type of the impurity distribution adjusts the threshold voltage at the exterior portions of the gate electrode.

* * * * *